Figure 1:
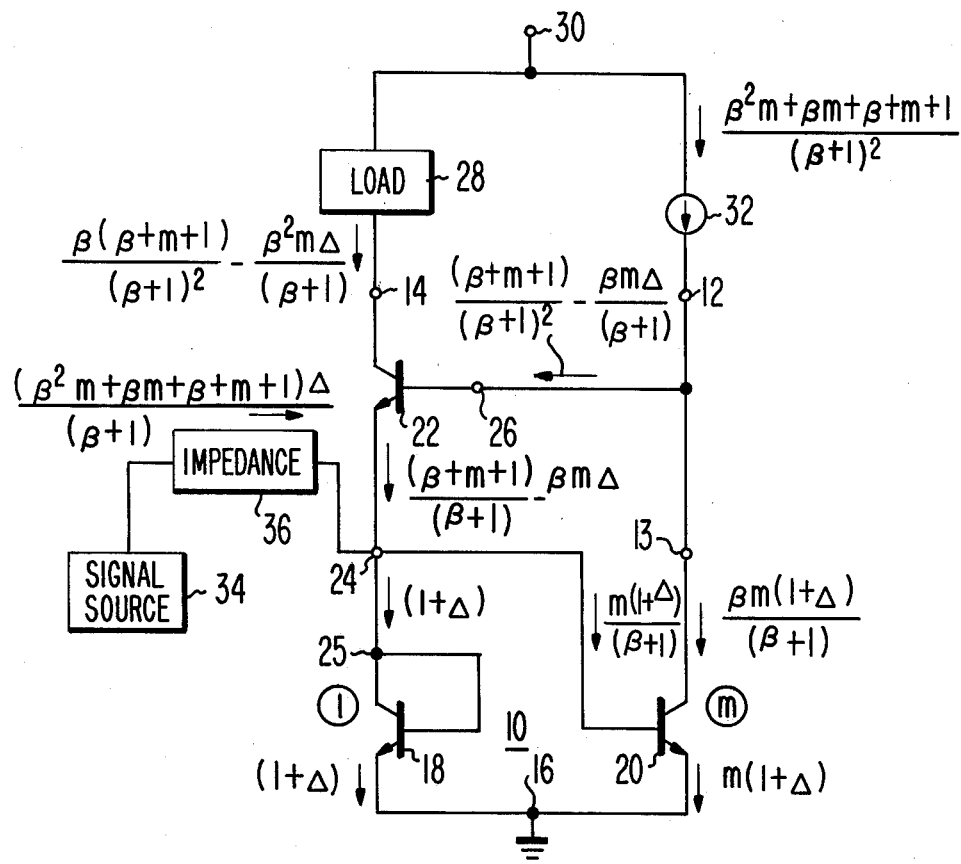

United States Patent [19]

Limberg

[11] 4,057,743
[45] Nov. 8, 1977

[54] CURRENT SENSING CIRCUIT

[75] Inventor: Allen LeRoy Limberg, Hopewell Township, Mercer County, N.J.

[73] Assignee: RCA Corporation, New York, N.Y.

[21] Appl. No.: 675,259

[22] Filed: Apr. 8, 1976

[51] Int. Cl.² .................................................. H03K 17/00
[52] U.S. Cl. ............................... 307/296 R; 307/229; 330/288; 330/296
[58] Field of Search .................. 307/229, 296; 330/14, 330/15, 26, 22, 40

[56] References Cited

U.S. PATENT DOCUMENTS

| 3,697,882 | 10/1972 | Plassche | 330/26 |
| 3,868,580 | 2/1975 | Battjes | 330/15 |
| 3,996,462 | 12/1976 | Fletcher et al. | 330/14 |

Primary Examiner—Stanley D. Miller, Jr.
Assistant Examiner—B. P. Davis
Attorney, Agent, or Firm—H. Christoffersen; S. Cohen; A. L. Limberg

[57] ABSTRACT

A current mirror amplifier (CMA) and another current amplifier are connected in a degenerative current feedback loop with a point therein which point exhibits a low a-c impedance with respect to a-c ground and provides for sensing signal current applied thereto from an impedance element. The CMA has an input terminal connected to this sensing point, a common terminal connected to a-c ground and an output terminal connected to a constant current source load. The other current amplifier has input and common terminals connected to the CMA output terminal and to the sensing point, respectively, and has an output terminal from which sensed signal current is available.

8 Claims, 4 Drawing Figures

CURRENT SENSING CIRCUIT

The present invention relates to circuits for sensing the current flow conducted by an impedance element.

It is known to employ a common-base amplifier transistor or a current mirror amplifier (CMA) to sense current conducted by an impedance element. A common-base amplifier transistor has unity current gain, and the input impedance at its emitter electrode is the reciprocal of its transconductance, or $g_m$. The current gain of a CMA is minus unity times the ratio between the $g_m$'s of the mirroring transistors, and its input impedance is inversely proportional to the $g_m$ of the one of these mirroring transistors in its input circuit.

For reasons discussed later, it is desirable in a current sensing circuit of the type dealt with here that the circuit have low input impedance. The input impedances of the current sensing circuits discussed above may be reduced, since transistor $g_m$'s are proportionally related to their respective emitter current flows, by increasing the quiescent current flows through the transistors the $g_m$'s of which determine the input impedances. However, this method, used alone, has been found to be unsatisfactory in some applications. The reason is that quiescent current levels required to obtain a sufficiently low value of input impedance become excessively large, presenting problems of overheating in integrated constructions. Further, the output current exhibits a large quiescent component responsive to the increased quiescent current applied to reduce input impedance, presenting problems insofar as direct coupling the response to the sensed input currents to later circuitry. The present invention is directed to current sensing circuits in which these problems are avoided while at the same time low input impedance is secured.

Figure 2:
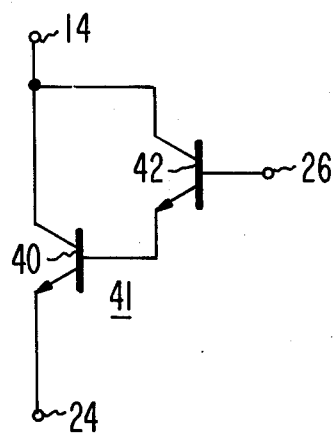
Figure 3:
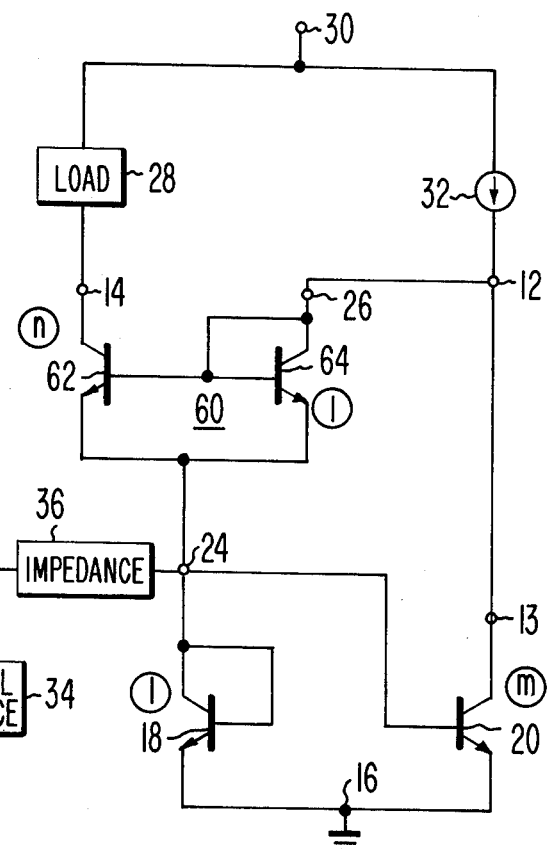
Figure 4:
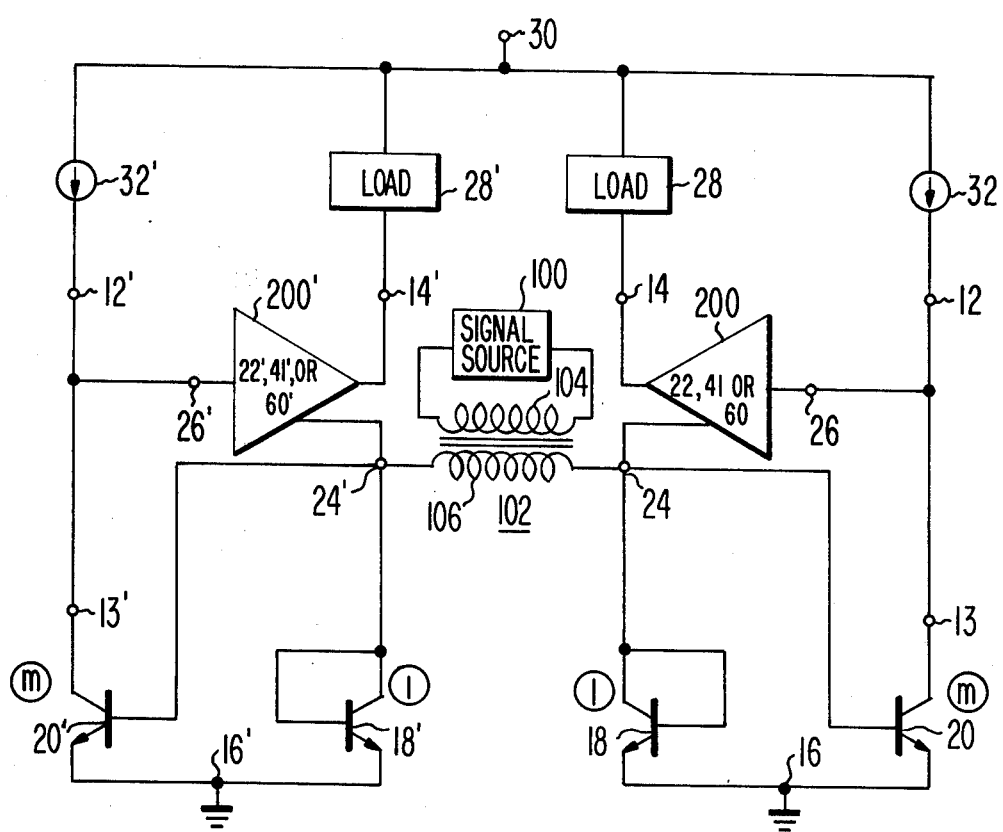

In the drawing, wherein corresponding elements of the figures have been given like reference designations:

FIGS. 1, 3 and 4 are diagrams, partly in block and partly in schematic form, of various embodiments of the invention; and FIG. 2 is a schematic diagram of a modification to a portion of the FIG. 1 circuit.

In FIG. 1 the transistors 18, 20 and 22 are assumed to have substantially the same common emitter forward current gain, $\beta$. The areas of the base-emitter junctions of transistors 18 and 20 are in one-to-$m$ ratio, $m$ being a positive number, preferably larger than one for reasons set forth hereinafter. If $m$ equaled one-half, the structure comprising the connections of transistors 18, 20 and 22 as amongst themselves and terminals 12, 14, 16 and 24 would resemble that of a balanced-to-single-ended converter described in U.S. Pat. Nos. 3,697,882 and 3,840,819. This balanced-to-single-ended converter was used to convert the balanced collector current variations of a pair of emitter-coupled differential amplifier transistors as applied to terminals 12 and 24, respectively, to a single-ended variation of the collector current of transistor 22 as demanded at terminal 14. Since a relatively high source impedance is presented by the collector circuits of the emitter-coupled differential amplifier transistors, the input impedances offered at terminals 12 and 24 are of no substantial concern in such a balanced-to-single-ended signal conversion arrangement.

The problem dealt with in the circuit of FIG. 1 is that of sensing the flow of current through a terminal of an impedance element 36. This current flows, for example, in response to a signal voltage applied to a first terminal of the impedance element 36 by a signal voltage source 34 when a second terminal of the impedance element 36 is connected to a point of substantially fixed potential such as that present at node 24 of the current sensing circuit. It should be appreciated that element 36 may represent a plurality of impedance elements connected to node 24 and source 34 may represent a corresponding number of signal sources. Signal voltage is supplied from source 34 without an accompanying direct current component, as may be arranged, for example, using a blocking capacitor (not shown) or other means. To ensure a simple Ohm's Law relationship between the signal voltage of source 34, the impedance 36 and the current flowing through 36, the input impedance presented by the current sensing circuit to the second terminal of impedance element 36 should be much lower — say, 100 times lower — than the impedance of element 36 itself. It is desired to have a signal current flow through load means 28 which is in predetermined fixed proportion to the signal current flow in impedance element 36. At the same time, it is desired to have a quiescent current flow through load means 28 which has a predetermined value that is low enough that direct coupling to amplifier stages that may comprise the load means 28 is facilitated.

In FIG. 1 and all subsequent figures, all transistors are bipolar NPN devices. CMA 10, which includes transistors 18 and 20, has an input terminal at 24, an output terminal 13, and a common terminal 16. The emitters of transistors 18 and 20 are connected to terminal 16. The collector of transistor 18 and the emitter of transistor 22 are connected to terminal 24 while the collector of the latter transistor is connected to terminal 14. The base and collector of transistor 18 are interconnected and connected to the base of transistor 20. The base of transistor 22 is connected through terminal 26 to terminal 12. Also connected to terminal 12 is the collector of transistor 20. Load device 28 is connected between terminal 14 and terminal 30 to which an operating voltage is applied. Bias current source 32 is connected between terminals 12 and 30. Signal source 34 is connected through impedance 36 to terminal 24.

In the operation of the current sensor circuit of FIG. 1, the quiescent collector current demand by transistor 22 at output terminal 14 of the current sensor is in substantially 1:$m$ proportion to a direct current supplied from constant current source 32. This direct current is applied through terminal 12 and while this terminal is connected both to the base electrode of amplifier transistor 22 and to terminal 13, only a portion of the current flows to the latter. The reason is the degenerative emitter-to-base current feedback provided to transistor 22 by CMA 10. CMA 10 has a current gain substantially equal to $-m$ as between its input and output terminals, $m$ being a positive number substantially larger than $1/\beta$. Base current flow to transistor 22 causes an emitter current flow response ($\beta + 1$) times as large, which, amplified by the current gain $-m$ of CMA 10, creates a quiescent collector current demand by transistor 20 that is larger than the base quiescent current demand of transistor 22 by a factor substantially equal to $m(\beta + 1)$. So, the degenerative current feedback loop causes substantially all the direct current supplied by source 32 to flow as quiescent collector current to transistor 20. The quiescent base current flow to transistor 22 causes transistor 22 to provide an emitter current substantially $m$ times as small as the collector current demand of transistor 20, to support that demand. This quiescent base current flow to transistor 22 supports a collector current demand by transistor 22 which if its $\beta$ be reasonably high (e.g., > 10) is substantially equal to its emitter current in amplitude. This quiescent biasing arrangement, where a direct current is applied to terminal 12, resembles that previously used in connection with current regulating apparatus as described in U.S. Pat. No. 3,588,672.

The operation of the circuit of FIG. 1 insofar as the sensing of signal current variations is concerned can be analyzed using the Superposition Theorem. Assume a normalized current into node 25 of $(1 + \Delta)$ units, where 1 represents the bias current component and $\Delta$ represents a current perturbation caused by signal source 34.

To analyze the quiescent behavior of the circuit, let the input signal current supplied by source 34 be zero-valued to cause all terms of which $\Delta$ is a factor to be zero-valued. A unit of quiescent emitter current through transistor 18 causes quiescent emitter current of $m$ units to flow through the emitter of mirroring transistor 20, where $m$ equals the mirroring ratio. The quiescent base current of transistor 20 equals $m/(\beta + 1)$. Thus, the emitter of transistor 22 supplies a quiescent current equal to the quiescent current into node 25 plus the quiescent base current of transistor 20 or $(\beta + m + 1)/(\beta + 1)$ units. The quiescent base current of transistor 22 equals its emitter current divided by $(\beta + 1)$, that is, $(\beta + m + 1)/(\beta + 1)^2$. The quiescent collector current of transistor 20 equals its quiescent emitter current times $\beta/(\beta + 1)$, that is, $\beta m/(\beta + 1)$. Bias source 32 must supply a normalized direct current equal to the sum of the base current of transistor 22 plus the collector current of transistor 20 or $(\beta^2 m + \beta m + \beta + m + 1)/(\beta + 1)^2$. The quiescent collector current of transistor 22 is equal to its quiescent base current times $\beta$, that is, $\beta(\beta + m + 1)/(\beta + 1)^2$. If $\beta$ is substantially larger than $m$, it can be shown that the quiescent collector current of 22 will be substantially equal to the direct current from source 32 divided by $m$.

Now let a signal current be supplied to terminal 24 to cause a perturbation $\Delta$ in the current flowing into node 25. This causes the collector current of transistor 20 to exhibit a perturbation $\beta m\Delta /(\beta + 1)$. Since the output current of bias source 32 is constant, the current flowing into the base of transistor 22 must exhibit a perturbation $-\beta m\Delta/(\beta + 1)$ in order that Kirchoff's Current Law be satisfied at the node to which terminal 12 connects. As a result, the emitter current of transistor 22 applied to terminal 24 exhibits a perturbation $-\beta m\Delta$. To satisfy Kirchoff's Current Law at terminal 24, signal source 34 supplies a current equal to the sum of the perturbation currents flowing through self-biased transistor 18 and to the base electrode of transistor 20, less the perturbation in the emitter current of transistor 22. So source 34 supplies a signal current of $$\frac{(\beta^2 m + \beta m + \beta + m + 1)}{(\beta + 1)} \Delta$$

to cause a perturbation of $\beta^2 m\Delta/(\beta + 1)$ in the current demanded of load 28. The current gain of the current sensor is, therefore, $$[\beta^2 m\Delta /(\beta+1)]/[\beta^2 m+\beta m+\beta+m+1)\Delta(\beta+1)] = \beta^2 m/(\beta^2 m + \beta m + m + 1).$$

Where $\beta$ is much larger than $m$, the value of the current gain approaches one.

Since the current required from source 34 is greater than the aforementioned current perturbation $\Delta$ by a factor $(\beta^2 m + \beta m + \beta + m + 1)/(\beta + 1)$, one surmises the degenerative current feedback connection reduces the input impedance between terminals 24 and 16 by this same factor as compared to the input impedance that would be observed were the connection between the emitter electrode of transistor 22 and terminal 24 severed and the transistor CMA supplied a bias current level of unity from a separate bias network. Since the open-loop input impedance of a CMA is reciprocally related to the level of input current applied to it, the input impedance of the circuit of FIG. 1 is equivalent to that of a conventionally operated (open-loop) CMA which has a much larger quiescent input current of value $(\beta^2 m + \beta m + \beta + m + 1)/(\beta + 1)$ applied to it. If this CMA had a current gain of the same value as the present current sensor, i.e., substantially equal to unity, it would respond to that applied quiescent input current with a quiescent output current equal to its input current, which current substantially equals $\beta m$. Similarly, low input impedance is achieved in the present current sensor while demanding only a quiescent current of $(\beta^2+\beta m + \beta)/(\beta +1)^2$ to flow through load 28; i.e., a quiescent output current of approximately $(\beta m)/[(\beta^2+\beta m+\beta)/(\beta + 1)^2]$ or approximately $m\beta$ times smaller than that of the conventionally operated CMA exhibiting similar input impedance.

The total quiescent current drawn by the conventionally operated CMA with similarly low input impedance has a normalized value equal to the sum of the quiescent output and input currents or $(m+1)$ $(\beta^2 m + \beta m +\beta +m+1)/(\beta+1)$, which substantially equals $(m+1)(m\beta)$. On the other hand, the total quiescent current drawn by the current sensor of FIG. 1 has a normalized value of $m+1$, that is, $m\beta$ times smaller. It should be noted that the reduction in current flow is directly proportional to the mirroring ratio $m$. It is, therefore, advantageous to select $m$ to be large with respect to one, for example, in the range of 5 to 10.

The circuit of FIG. 1 may be modified by replacing transistor 22 with the Darlington cascaded transistor pair 41 of FIG. 2. In the latter figure, the collectors of transistors 40 and 42 are connected to terminal 14, and the base of transistor 42 is connected to terminal 26. The emitter of transistor 42 is connected to the base of transistor 40 while the emitter of this latter device is connected to terminal 24. The operation of the circuit of FIG. 1 may be viewed as a feedback amplifier wherein an amplifier, transistors 18 and 20, has a degenerative feedback path comprising transistor 22. As a result of the presence of the feedback, the impedance at terminal 24 is reduced. Replacing transistor 22 with the Darlington transistor pair of FIG. 2 increases the loop gain of the modified circuit by an amount essentially equal to the increased current gain of the pair 41 compared to the gain of transistor 22. As a result, the impedance at node 24 of the modified circuit is reduced compared to the impedance of the circuit of FIG. 1 in its original form. The currents flowing in the modified circuit may be determined from the teachings of the descriptions of the circuit of FIG. 1 and as such are not derived herein.

The circuit of FIG. 3 modifies the circuit of FIG. 1 by replacing transistor 22 of the latter circuit with a CMA 60 having a gain $n$. In CMA 60, the emitters of transistors 62 and 64 are connected to terminal 24 while the bases of these transistors are connected to each other as well as to the collector of transistor 64. The collectors of transistors 62 and 64 are connected to terminals 14 and 26, respectively. The circuit of FIG. 3 offers the advantage of reduced input impedance as do the previous circuits but in addition, the dependence of the input impedance on the $\beta$'s of the component transistors is reduced compared to the circuits of FIGS. 1 and 2. This is because the current from CMA 60 flowing into terminal 24 is substantially independent of the current gains of transistors 62 and 64.

The input signal current to the circuit of FIG. 1 to support a current of $\Delta$ units flowing into node 25 was shown to equal $$\frac{(\beta^2 m + \beta m + \beta + m + 1)}{(\beta + 1)} \Delta \quad (1)$$

It should be noted that the numerator of equation 1 contains a $\beta$ term of higher order than does the denominator. This means that the input impedance of the circuit of FIG. 1, which is inversely proportional to the input current, tends to vary as $1/\beta$. Thus, while providing a reduced input impedance, the value of this impedance tends to vary with the $\beta$ variations of the component transistors. In integrated circuit technology, such a variation may extend over a 3:1 range. The circuit of FIG. 2, while exhibiting a lower input impedance than the circuit of FIG. 1 can also be shown to be highly $\beta$ dependent. In certain applications, such as providing a short circuit termination of an LC filter, it is desirable that the current sensor unit presents a well defined low input impedance to the preceding circuitry. It is, therefore, desirable to reduce the $\beta$-dependency of the current sensor input impedance.

The input signal current of the circuit of FIG. 3 necessary to support a signal current $\Delta$ into node 25 can be shown to equal:

$$\frac{[(mn + m + 1)\beta^2 + (m + 1)(n + 2)\beta + (m + 1)(n + 1)]}{\beta^2 + (n + 2)\beta + (n + 1)} \Delta \quad (2)$$

Both the numerator and denominator of (2) are second-order polynomial functions of $\beta$. As a result, $\beta$ variations in the circuit of FIG. 3 tend to have the same effect on both the numerator and denominator of (2) thus having much less effect on the input impedance of this circuit than do similar $\beta$ variations in the earlier described circuits. In addition, $m$ and $n$ may be chosen to reduce the effects of $\beta$ variations even further. It should be noted that value of the relatively $\beta$ independent input impedance is higher than that obtained in the circuits of FIGS. 1 and 2. This is because the gain of amplifier 60 is less than the gains of amplifiers 22 or 41. As a result, the loop gain of the circuit of FIG. 3 is lower than that of the previous circuit, resulting in a higher input impedance. It should be emphasized, however, that this impedance is still much lower than that of a conventional CMA operated at the same quiescent current level.

By the same process used for comparing the current sensor of FIG. 1 with a conventionally operated CMA of similar input impedance, one can determine that the circuit of FIG. 3 has a quiescent current that is smaller than that of a conventional CMA by a factor equal to expression (2) multiplied by $(n+1)(\beta+1)/\beta n$ to realize a given input impedance. This factor approximately equals mn. The total quiescent current demand is smaller by a factor $[(mn+m+1)\beta^2+(m+1)(n+2)+(m+1)(n+1)]/(m+1)[\beta^2+(n+2)\beta+(n+1)]$ or approximately $n$.

In the circuit of FIG. 4, a pair of current sensing circuits connected in a differential input configuration with the secondary winding 106 of transformer 102 connected between their respective input terminals 24 and 24'. Transformer winding 102 is shown as having a primary winding 104 supplied from a signal current source 100 which connection may be considered a general equivalent input circuit for a variety of transformer or transformer-like devices. For example, the winding 106 may be the coil associated with a magnetic tape playback head having current induced therein by the passage of magnetized tape past a magnetic core or the sensing coil of a differential current sensing transformer employed in a ground fault interruptor circuit. The advantages of short-circuit terminations of such windings are known. The similar quiescent potentials appearing at terminals 24 and 24' cause winding 106 to be in bridge connection for quiescent currents, desirably precluding direct current flow through this winding. The very low impedances presented to the winding 106 by terminals 24 and 24' provide an adequate approximation to short circuit terminations of the winding.

In the circuit of FIG. 4, amplifier 200 has its input, output and common terminals connected to terminals 26, 14 and 24, respectively. Corresponding connections exist for amplifier 200'. These amplifiers may be realized with transistor 22, Darlington pair 41 or CMA 60 of the previous figures. While the load means shown comprises loads 28 and 28' driven in push-pull, one of these loads may be replaced by direct connection if only single-ended output signal is required.

While the above described circuits are realized with bipolar NPN transistors, such circuits may also be realized with PNP transistors or such conductor-insulator-semiconductor devices such as metal-oxide-semiconductor transistors. The utilization of current mirror amplifiers of configurations different from those disclosed herein should also be considered within the scope of the present invention.

What is claimed is:

1. In a current sensing circuit for sensing the flow of current through one of the terminals of an impedance, which circuit includes first and second terminals between which an operating potential may be applied;

means for establishing a current through said impedance;

a current mirror amplifier having input, output and common terminals, said common terminal being connected to said first terminal and said input terminal being connected to said one terminal of said impedance;

amplifier means having input, output and common terminals, said amplifier means common terminal connected to said one terminal of said impedance;

a constant current source for supplying a direct current, said source connected between said second terminal and an interconnection between the output terminal of said current mirror amplifier and the input terminal of said amplifier means; and load means including a direct current path connected between said second terminal and said amplifier means output terminal;

an improvement for lowering the input impedance of said current sensing circuit without need for increasing the current through said load means comprising said current mirror amplifier exhibiting a current gain as between its input and output terminals that is substantially greater than unity.

2. An improved current sensing circuit as set forth in claim 1 wherein said amplifier means comprises a transistor having base, collector and emitter electrodes, said electrodes comprising said amplifier means input, output and common terminals, respectively.

3. An improved current sensing circuit as set forth in claim 1 wherein said amplifier means comprises first and second transistors, said transistors each having base, emitter and collector electrodes, said first transistor base electrode comprising said amplifier means input terminal, said first and second transistor collector electrodes being interconnected and forming said amplifier means output terminal, said first transistor emitter electrode being connected to said second transistor base electrode, and said second transistor emitter electrode comprising said amplifier means common terminal.

4. An improved current sensing circuit as set forth in claim 1 wherein said amplifier means comprises a second current mirror amplifier having input, output and reference terminals to which said amplifier means input, output and common terminals, respectively, correspond.

5. A circuit for sensing the current in an impedance element without applying a potential thereacross which would in accordance with Ohm's Law give rise to spurious current flow therethrough, said circuit comprising, in combination:
first and second terminals for connection to reference and operating potentials, respectively;
third and fourth terminals between which said element is connected;
a first current mirror amplifier having input, output and common terminals, said common terminal thereof being connected to said first terminal and said input terminal thereof being connected to said third terminal;
first amplifier means having input, output and common terminals, said common terminal thereof being connected to said third terminal;
a first constant current source for supplying a direct current, said source connected between said second terminal and an interconnection between the output terminal of said first current mirror amplifier and the input terminal of said first amplifier means;
a direct current path between said second terminal and said first amplifier means output terminal;
a second current mirror amplifier having input, output and common terminals, said second current mirror amplifier having its common terminal connected to said first terminal and its input terminal connected to said fourth terminal
second amplifier means having input, output and common terminals, said second amplifier common terminal connected to said fourth terminal
a second constant current source for supplying a direct current, said source connected between said second terminal and an interconnection between the output terminal of said second current mirror amplifier and the input terminal of said second amplifier means; and a direct current path between said second terminal and said second amplifier means output terminal; and
load means being included in at least one of said direct current paths.

6. A circuit for establishing a low impedance between the respective ends of an impedance element and a point at a reference potential comprising, in combination:
first and second current mirror amplifiers, each amplifier having input, output and common terminals, said common terminals connected to said point at a reference potential and said input terminals each connected to a respective end of said impedance; and
first and second degenerative feedback means said first means connected between said first current mirror amplifier input and output terminals and said second means connected between said second current mirror amplifier input and output terminals.

7. A current sensing circuit for sensing the flow of current through one of the terminals of an impedance, said circuit comprising:
first and second terminals between which an operating potential may be applied;
means for establishing a current through said impedance;
a first current mirror amplifier having an input terminal connected to said impedance to receive the current therethrough, having an output terminal, and having a common terminal connected to said first terminal;
a second current mirror amplifier having an input terminal, having an output terminal, and having a common terminal connected to the input terminal of said first current mirror amplifier;
a constant current source for supplying a direct current, said source connected between said second terminal and an interconnection between the output terminal of said first current mirror amplifier and the input terminal of said second current mirror amplifier; and
load means including a direct current path connected between said second terminal and the output terminal of said second current mirror amplifier.

8. A method for providing short-circuit termination between first and second ends of a coil and for sensing current arising in said coil without applying appreciable potential across said coil as will undesirably give rise to spurious current flow in said coil, said method comprising the concurrent steps of:
connecting the first end of said coil to the input terminal of a first current mirror amplifier;
connecting the second end of said coil to the input terminal of a second current mirror amplifier similar to said first current mirror amplifier;
applying a reference potential to an interconnection between the common terminals of said first and second current mirror amplifiers;
supplying first and second currents of predetermined respective magnitudes;
comparing said first current to the current demanded at the output terminal of said first current mirror amplifier to obtain a first error signal;
comparing said second current to the current demanded at the output terminal of said second current mirror amplifier to obtain a second error signal;

applying said first error signal to the input terminal of a further amplifier means having its common terminal connected to the input terminal of said first current mirror amplifier, for completing a direct-coupling feedback loop that reduces the impedance offered between the first end of said coil and said interconnection;

applying said second error signal to the input terminal of a still further amplifier means having its common terminal connected to the input terminal of said second current mirror amplifier for completing a direct-coupled feedback loop that reduces the impedance offered between the second end of said coil and said interconnection; and utilizing the output current of said further amplifier means.

* * * * *

UNITED STATES PATENT OFFICE
CERTIFICATE OF CORRECTION

PATENT NO. : 4,057,743

DATED : November 8, 1977

INVENTOR(S) : Allen LeRoy Limberg

It is certified that error appears in the above-identified patent and that said Letters Patent are hereby corrected as shown below:

Col 3, lines 65-67 should read -- $[\beta^2 m\Delta/(\beta+1)]/[(\beta^2 m+\beta m+\beta+m+1)\Delta/(\beta+1)] = \beta^2 m/(\beta^2 m+\beta m+\beta+m+1)$ --

Col 5, line 56, "circuit" should be --circuits--

Col 9, line 5, "coupling" should be --coupled--

Signed and Sealed this

Twentieth Day of June 1978

[SEAL]

Attest:

RUTH C. MASON
*Attesting Officer*

DONALD W. BANNER
*Commissioner of Patents and Trademarks*